Aug. 2, 1960 T. E. PARDUE 2,947,924

SEMICONDUCTOR DEVICES AND METHODS OF MAKING THE SAME

Filed Oct. 8, 1956 2 Sheets-Sheet 1

INVENTOR.
Turner E. Pardue
BY
Mueller & Aichele
Attys.

Aug. 2, 1960 T. E. PARDUE 2,947,924

SEMICONDUCTOR DEVICES AND METHODS OF MAKING THE SAME

Filed Oct. 8, 1956 2 Sheets-Sheet 2

INVENTOR.
Turner E. Pardue
BY Mueller & Aichele
Attys.

United States Patent Office 2,947,924

Patented Aug. 2, 1960

2,947,924

SEMICONDUCTOR DEVICES AND METHODS OF MAKING THE SAME

Turner E. Pardue, Tempe, Ariz., assignor to Motorola, Inc., a corporation of Illinois Filed Oct. 8, 1956, Ser. No. 614,417

20 Claims. (Cl. 317—235)

This is a continuation-in-part of my copending application Serial No. 544,699, filed November 3, 1955.

The present invention relates to semiconductor devices and methods of making the same, and more particularly to high frequency transistors having a zone therein of high resistivity material approaching intrinsic conductivity characteristics and methods of making the same.

Since the original development of the junction transistor, many advances have been made in the art in extending its useful frequency range. These advances have brought the performance of the commercial junction transistor close to the optimum possible with that particular structure and available techniques. The concept of the intrinsic barrier transistor represents an attempt to alter the structure of the original junction transistor in such a manner that the useful frequency range of the resulting transistor is materially greater than the range of the ordinary junction transistor.

This latter type of transistor may be of either the p–n–i–p type or the n–p–i–n type. In such a transistor, an intrinsic collector zone is provided in the crystal to reduce the collector capacitance and increase the collector breakdown voltage. Devices of this general type are discussed in the Bell System Technical Journal for May 1954, in an article by J. M. Early starting on page 517. As described in this article, the structure referred to above permits the simultaneous achievement of high alpha cutoff frequency, low ohmic base resistance, low collector capacitance, and high collector breakdown voltage.

Transistors of this general type are known variously as the p–n–i–p (or its homologue, the n–p–i–n), or the intrinsic barrier transistor. The unit was usually made in the prior art by preparing a monocrystal wafer of semiconductor material composed of a first thin lamellar region of a selected conductivity type and an adjacent lamellar region of intrinsic semiconductor. It is usual in present day practice to use germanium for the semiconductor crystal, and for the first lamellar region to be of the negative conductivity or n-type. However, other semiconductor materials such as silicon can be used, and the crystal can be an n–i-type structure or a p–i-type structure depending on whether a p–n–i–p or n–p–i–n transistor is desired.

The problem prior to the present invention has been to find a practical transistor structure that approaches in design the theoretical requirements for optimum performance, and also methods of making the transistors capable of being carried out sufficiently economically so as to make the process commercially feasible and the resulting unit relatively inexpensive.

An object of the invention is to provide new and improved semiconductor devices and methods of making the same.

Another object of the invention is to provide new and improved high frequency transistors having a zone therein of high resistivity material approaching intrinsic conductivity characteristics and methods of making the same.

Another object of the invention is to provide high frequency transistors having parameters equal to those of p–n–i–p and n–p–i–n transistors and methods of making the same.

Another object of the invention is to provide high frequency transistors having high reproductability in economical commercial production, and methods of making the same.

Another object of the invention is to provide simple, rugged, economically produced transistors.

Another object of the present invention is to provide an improved, simple, and effective method for fabricating transistors of the type described above.

Another object of the invention is to provide an improved transistor unit fabricated in accordance with the method or process of the present invention.

One feature of the invention is to provide a semiconductor device including a die having high resistivity substrate of one conductivity type and a graded base surface layer of the same conductivity type with a rectifying electrode on the graded base layer and a second electrode on the substrate, and methods of making the same.

Another feature of the invention is the provision of rectifying contacts or electrodes on a high resistivity semiconductor wafer having a surface layer of a selected conductivity type, which contacts are formed by means of a jet-etch-plate technique, with one contact being formed in contact with the surface layer, and the other in a cavity and in contact with the high resistivity region of the semiconductor.

Another feature of the invention is to provide high frequency transistors of semiconductor material having a zone of high resistivity, and methods of making the same.

Another feature of the invention is to provide transistors having low collector capacitance, low emitter to base resistance and high frequency of operation, and methods of making the same.

Another feature of the invention is to provide transistors having the high frequency response of p–n–i–p and n–p–i–n transistors and which may be fabricated without the difficulties encountered in making the p–n–i–p and n–p–i–n transistors, and methods of making the same.

The above and other features of the invention which are believed to be new are set forth with particularity in the appended claims. The invention itself, however, together with further objects and advantages thereof, may best be understood by reference to the following description when taken in conjunction with the accompanying drawings in which:

The invention provides an improved transistor and process for fabricating it, which process comprises providing a semiconductor crystal wafer of a high resistivity of one conductivity type, diffusing an impurity into the crystal wafer to provide an enriched, graded-impurity-concentration surface layer of the same conductivity type but of lower resistivity over all the surfaces of the crystal, forming the wafer into dice and mounting the dice on a base strip. Then, a first jet composed of a chemical solution of a salt of a selected metal is applied to one face of each of the dice while an electric current is passed through the jet and the die to etch a collector pit completely through the surface layer. Then the first jet is continued, a second opposed jet with etching current is applied to the opposite face of the disc to clean an emitter area on the outer portion of the diffused surface layer, and the currents are reversed to plate electrodes on the surfaces forming the emitter area and the bottom of the collector pit in rectifying contact therewith. Then the base strip is cut to form individual die assemblies, which are incorporated into header structures.

Specific examples of the transistor and the improved process of the invention will now be described. It is to be understood and it will be evident as the description proceeds, that the process does not depend upon any specific material or upon any specific dimensions, and that these may vary without departing from the scope and spirit of the invention.

Figure 1:
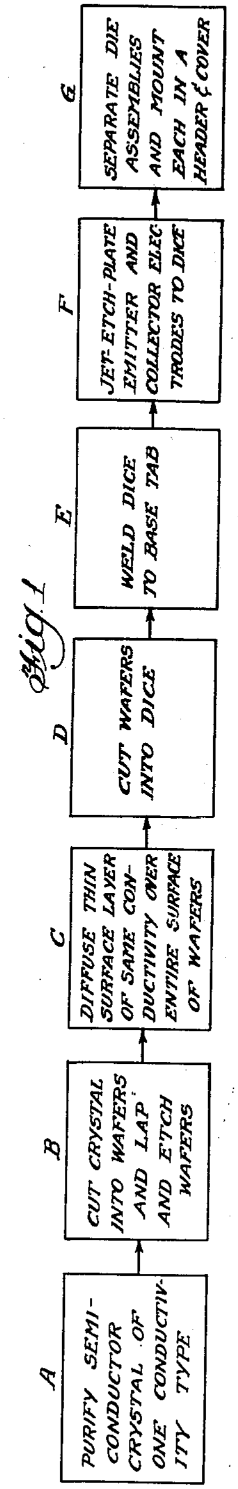
Fig. 1 represents various steps included in a process of the invention.

In practicing the invention, there are provided thin semiconductor wafers composed, for example, of high resistivity, or nearly intrinsic, n-type conductivity single crystal germanium or of essentially intrinsic germanium. Silicon also may be used. These wafers may be provided by purifying a block of germanium (step A in Fig. 1). This purification may conveniently be carried out by the zone purifying process described by Pfann in the Transactions of the American Institute of Metallurgical Engineers, Journal of Metals, July 1952, page 747, "Principles of Zone Melting." It is possible by this process to obtain highly purified and nearly intrinsic n-type conductivity germanium with the resistivity desired, that is, with a resistivity of at least 10 to 15 ohm-centimeters, more or less, and preferably more than 20 ohm-centimeters. Hereinafter, in the use of the term "high resistivity" it is meant resistivity of from about 5 or 10 to 15 ohm-centimeters to a resistivity substantially that of intrinsic semiconductor material. Also, in the use of the terms "n′" and "n′-type," it is meant high resistivity n-type conductivity.

The crystal block is then cut into wafers (step B) by any known cutting processes using, for example, a thin diamond or silicon carbide wheel. It is desirable but not essential that these wafers be formed to have their opposite faces parallel to the Miller (211) crystallographic planes.

The wafered crystals are then mechanically lapped or otherwise ground by any known lapping process. After lapping, the wafers are etched so that each has a final thickness of, for example, 0.0038″. This etching is accomplished by the use of a suitable etching solution such as:

| | Cc. |
|---|---|
| 70% nitric acid ($HNO_3$) | 5 |
| 52% hydrofluoric acid (HF) | 5 |
| Distilled water | 1 |

These wafers are composed of high resistivity n-type germanium. Enriched thin surface or base layers 11 and 11a of n-type conductivity are then formed over all the surfaces of each wafer (step C), leaving a substrate or inner layer 14 undiffused. These surface layers are conveniently formed by exposing the wafer of high resistivity germanium at elevated temperatures to the vapor of a suitable impurity, such as arsenic or antimony, antimony being used in the specific example being described. The impurity vapor diffuses into the germanium producing a thin graded base layer of n-type germanium of precisely selected thickness, preferably of the order of from 0.0002 to 0.0003 of an inch, more or less, whose resistivity varies exponentially from a low value of the order of 0.01 ohm-centimeter at the outer surface to the high resistivity value of 10 to 20 or more ohm-centimeters within the crystal, the surface resistivity and the spatial distribution being easily controlled by well defined parameters (time and temperature and vapor pressure) governing the diffusion process. Hereinafter, in referring to the base layer of low resistivity n-type material, the term "n-type" will be used, thus distinguishing from the high resistivity central portion designated as n′-type material. In the use of the term "low resistivity" hereinafter, it is meant resistivity lower than the resistivity of the substrate 14 of the wafer or die to which reference is made. When antimony is used, the diffusion process is carried out at a temperature of 600–800° C. and for a time interval of 1 to 24 hours.

Figure 3:
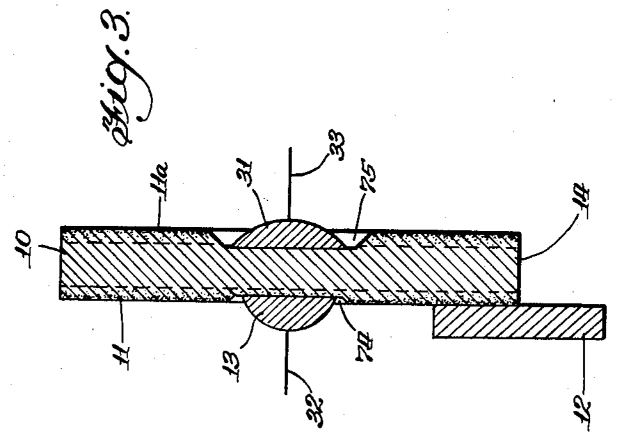
Fig. 3 is an enlarged sectional view of a portion of a transistor constructed in accordance with the invention.

The specific diffusion process described in the preceding paragraph produces n-type surface layers, and any suitable element from the nitrogen group can be used for this purpose. The impurity concentration decreases exponentially from the outer surface of the base layer into the wafer to produce what is commonly called a graded base layer which aids transport of minority carriers, in this instance holes, across the base layer. Therefore, as shown in Fig. 3, there is now provided a germanium wafer having a substrate 14 of near intrinsic or high resistivity characteristics, i.e., high resistivity n′-type material, and also having surface layers 11 and 11a of n-type conductivity.

Figure 5:
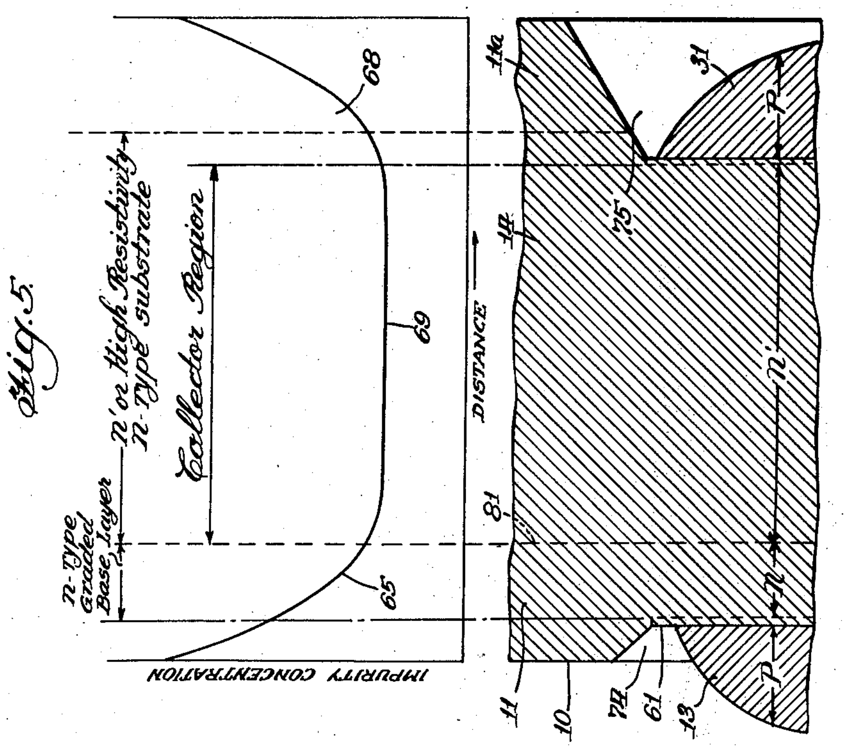
Fig. 5 is an enlarged sectional view of a transistor die assembly of the invention along with an impurity concentration chart.
Figure 4:
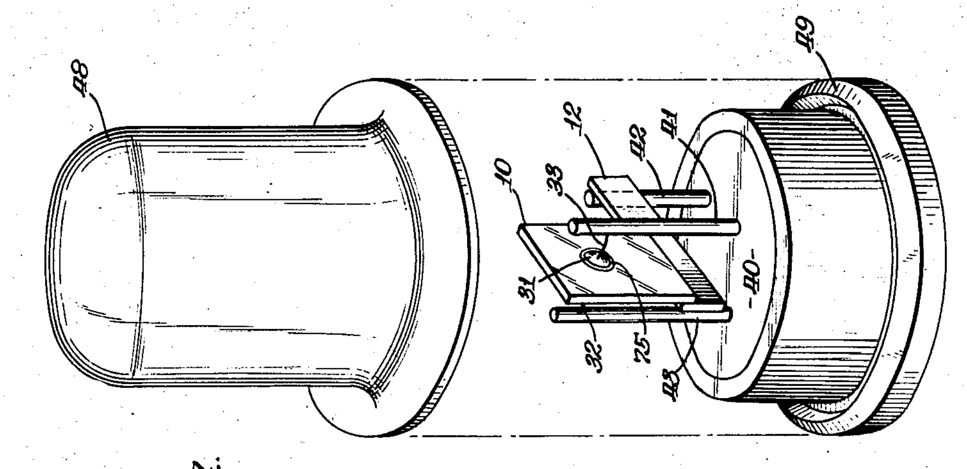
Fig. 4 is a perspective view of a transistor constructed by the invention.

The concentration of the diffused impurity follows line portions 65 and 68 (Fig. 5) having steep slopes flattening out exponentially to blend with a line 69 indicating the initial low or n′ impurity concentration of the substrate or undiffused layer 14 of the wafer. The impurity concentration at the outer face of the base layer 11 is from about $10^{17}$ to about $10^{18}$ antimony atoms per cubic centimeter, and this concentration sharply decreases exponentially to a concentration of from about $10^{13}$ to about $10^{14}$ donor atoms per cubic centimeter in the undiffused substrate 14. The wafer is decontaminated, if necessary, to restore high resistivity of the substrate, and is cut into dice 10, each of which may have dimension of 0.0038″ x 0.065″ x 0.145″. In accordance with step E, a rigid metallic base ribbon or strip 12 (Fig. 3) composed, for example, of nickel or silver coated with tin, is fused to one face of each crystal die 10, namely, the face of the layer 11 which is to support the emitter electrode. The ribbon 12 forms an ohmic electrical electrode on the base layer 11 of each die 10, and may be fused to the faces of the dice 10 by subjecting the assembly to a temperature of 300 to 600° C.

Figure 2:
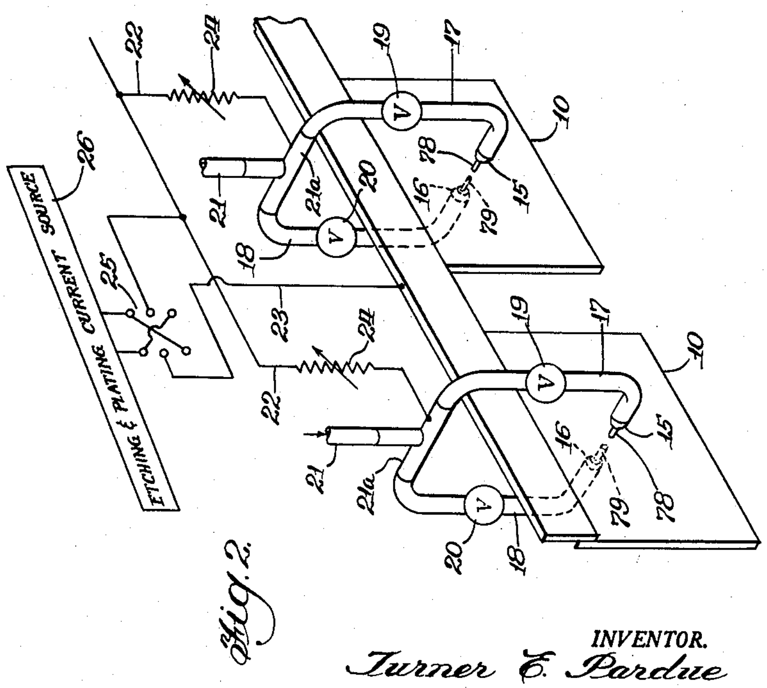
Fig. 2 is a schematic representation of apparatus suitable for use in carrying out the invention.

The assembly of dice 10 and the elongated strip 12 is then supported in the apparatus shown schematically in Fig. 2, and this apparatus enables pairs of directly opposed electrolytic jets to be directed at opposite faces of the dice 10. The apparatus includes pairs of opposed nozzles 15 and 16, and these nozzles are connected by glass tubes 17 and 18 and through respective valves 19 and 20 to a common pipe line 21. The common line has a metal section 21a to which an electrical lead 22 is connected so as to establish electrical connection to the electrolyte solution which is passed therethrough. An electrical lead 23 is electrically connected to the base electrode 12, and leads 22 and 23 are connected through a variable resistor 24 to the center contacts of a reversing switch 25. The reversing switch is connected to a source of direct current 26.

In accordance with step F to jet-etch-plate emitter and collector electrodes 13 and 31 respectively, valve 19 is closed and valve 20 is opened so that an electrolytic solution passes through tubes 21, 21a and 18 to issue as jets 79 from nozzles 16. Switch 25 is placed in a position so that a direct current from source 26 flows through the electrolyte and the dice 10 in a direction to produce an etching action between the jets from nozzles 16 and the surfaces 11 of the dice 10. Light is directed onto the surfaces of the dice during the etching action to illuminate the surfaces and aid the etching action by increasing the flow of minority carriers in the dice, as is understood by the art. The amount of current is controlled by resistor 24 and is adjusted to about 0.003 amp. After a predetermined time interval of, for example, 310 seconds with an electrolyte temperature of 100° F., sufficient to etch flat-bottomed collector pits 75 through the layers 11a slightly into the substrates 14, the valve 19 also is opened and jets 78 are impinged on the dice 10 on points directly opposite to the jets 79 and an etching current of about 0.002 amp. is flowed through the jets 78 for a predetermined period of time to etch shallow, flat-bottomed emitter pits 74 in the base layers 11. In one example, the bottoms of the emitter pits have a diameter of 0.012 to 0.014 inch, and a depth of 0.0001 inch, and the diameter of the bottom of the collector pit 75 was from about 0.014" to 0.016" and the depth of the pit was 0.0031". This etching of the emitter pits may be sufficient merely to remove a minute amount of the dice to clean the surface of the base layers 11, or may be just slightly more to form the bottoms of the emitter pits at a predetermined point on the impurity concentration gradient, for example, at a point at which the resistivity of the base layer is of the order of 0.1 ohm-centimeter, at which point the contact of the electrode with the die may be readily tested. An excellent depth of the emitter pits 74 both for testing the quality of the junction between the emitter electrodes 13 and the bottoms of the pits 74 and for providing a steep slope of the impurity concentration gradient in the portion of the base layer 11 from the bottom of the pit 74 on into the die, it has been found to be that at which the impurity concentration is from about $10^{16}$ to about $10^{17}$ donor, in this instance antimony, atoms per cubic centimeter.

The currents through the jets 78 and 79 then are reversed, without interruption of the flow of the jets, to plate metal electrodes or contacts 13 and 31 on the bottoms of the pits 74 and 75, respectively. The plating is stopped before the electrodes 13 and 31 reach the outer peripheries of the bottoms of the pits 74 and 75 so that the electrical contact between the electrodes and the dice is only at the bottoms of the pits. However, the periphery of the emitter electrode should be within from 0.001 to 0.002" of the walls of the pit 74 to keep the emitter to base resistance low. Then, the dice 10 and ribbon 12 are removed from the jet-etch-plate apparatus, and are immersed in a suitable etching fluid to clean the peripheries of the contacts 13 and 31, and the ribbon 12 is cut to form die assemblies, each die assembly including a portion of the ribbon 12 forming a base contact or electrode, one of the dice 10, the collector electrode 31, and the emitter electrode 13.

The electrodes 13 and 31 may be formed of zinc from an electrolyte having the following compositions:

| | Grams/litre |
|---|---|
| Zinc sulphate ($ZNSO_4.7H_2O$) | 15 to 75 |
| Ammonium acetate ($CH_3COONH_4$) | 5 to 30 |
| Ammonium chloride ($NH_4Cl$) | 5 to 75 |

Suitable leads or conductors 32 and 33 of, for example, 0.002" diameter wires composed of nickel, may be soldered respectively to the emitter and collector electrodes by any suitable soldering or welding technique after brazing the base ribbon 12. The conductors 32 and 33 are connected in any suitable manner to respective connectors 41 and 43, which may be of "Kovar" or other suitable metal. The connectors are mounted in a glass mounting base 40 and a cover 48 encloses the assemblage and is hermetically sealed to metallic cup 49 holding the base 40.

Any suitable known etching and cleaning operations can be made to the unit. For example, the assembly may be subjected to an electrolytic etch such as described in copending application Serial No. 455,575, filed September 13, 1954, in the name of Charles Ackerman and assigned to the present assignee. The transistor may also be given a suitable surface coat using, for example, Dow Corning 997 silicon varnish mixed with xylene. The assembly may then be potted and placed in a suitable enclosure or cover and subjected to a final test.

In the operation of the transistor described above, voltage bias is applied across the collector electrode 31 and the base and emitter electrodes 12 and 13 respectively, and a space-charge or electric field region is formed in the substrate 14 by the collector electrode voltage in the substrate 14. The collector space charge region spreads from the bottom or inner face of the electrode 31 into the vicinity of a line 81 which indicates the general position of the junction of the base layer 11 and the undiffused region 14 giving low collector capacitance. This gives the thickness from the surface 61 to the line 81 as the effective base layer portion of the transistor and, since the base layer 11 has a very sharp impurity concentration gradient, it has a built-in field for transporting holes through the base layer 11 into the collector region, which is now the undiffused region 14.

The penetration and impurity concentration gradient of the base layer 11 are very precisely controlled, and the thickness of the substrate or undiffused region 14 also is very precisely controlled. The depth of etching of the pits 74 and 75 and the p-n junctions formed at the bottoms of the contacts 13 and 31 are very precisely located in each die 10. All these factors provide excellent reproducibility of the die assemblies from the dice 10 with economical production methods thereof. Since the region 14 acts primarily as a portion of the collector resistance in the operation of the transistor, and as a space charge region to decrease the collector capacitance, precisely positioned rectifying electrodes are easily formed on opposite sides of each die, and the region 14 may be of substantial thickness to provide mechanical strength to the portion of the die between the electrodes 13 and 31. Also, because the substrate is a space charge region, its thickness is not critical.

In the n'-type substrate 14, the actual p-n or rectifying junction is believed to be just under the inner face of the collector electrode 31 and in the substrate itself. In the use of the transistor, the collector electrode 31 is biased by a reverse voltage applied thereto. The effect of this bias voltage of the collector is to produce an electric field in the substrate 14, which field minimizes transit time of minority carriers, holes in this instance, from the base layer 11 to the collector contact 31. Thus, insofar as transit time is concerned, the substrate 14 may be thick enough to provide mechanical supporting strength for the thin base layer and also to reduce collector capacitance. The n' substrate while actually of n-type conductivity has sufficient resistivity that the above described electric field can be created so that the transistor described above has all the advantages of a true p-n-i-p type.

In the transistor described above, both the emitter contact 13 and the base contact 12 are electrically connected to very low resistivity portions of the base layer so that there is very low resistance between the emitter electrode and the base electrode to minimize power loss therebetween. In references to values of resistivity herein, it is meant, unless otherwise indicated, the values of the resistivities at about room temperature, about 70° F.

The invention provides, therefore, a relatively simple and economical process for fabricating high frequency transistors using a high resistivity zone in the semi-conductor. By means of the present process, the diffusion of the surface layer can be accurately controlled, and the formation of plated rectifying contacts may also be accurately controlled so that the geometry of the finished unit can be made to approach the theoretical configuration required for satisfactory high frequency operation, and this can be achieved conveniently and on a commercially feasible basis. Also, the transistor described herein, while actually of a p-n-n'-p type, has all the advantages of the true p-n-i-p transistor while being far more economical to produce.

I claim:

1. A process for forming a semiconductor device which comprises providing a semiconductor crystal of high resistivity, diffusing an impurity substance into the crystal to form a surface layer of one conductivity type and of substantially lower resistivity over all the surfaces of the crystal, forming a first electrode on one face of the crystal in rectifying contact with the surface layer, forming a cavity in the other face of the crystal opposite said first electrode and extending into said crystal beyond said surface layer, and forming a second electrode on the bottom of said cavity directly opposite said first electrode and in contact with the high resistivity portion of the crystal.

2. A process for forming a transistor which comprises providing a semiconductor crystal die of a high resistivity of the order of 20 ohm-centimeters of one conductivity type and having surface layers of said conductivity type and of a low resistivity of the order of 0.01 ohm-centimeter over opposed faces of the die, forming a first rectifying contact on one face of the die on one of said surface layers, forming a cavity in the other face of the die extending into the die beyond the other surface layer, and forming a second rectifying contact directly opposite to said first contact on the high resistivity portion of said die at the bottom of said cavity.

3. A process for fabricating a transistor which comprises providing a semiconductor die of high resistivity and having a surface layer of one conductivity type over the opposed faces of the die, directing an electrolytic jet onto one face of the die, passing an electric current through the jet and the die to plate a first electrode on said face in rectifying contact with said surface layer, directing an electrolytic jet onto the opposite face of the die, passing an electric current through said last-named jet and the die to etch a cavity in such opposite face extending into the die beyond said surface layer, and reversing the current through said die and last-named jet to plate a second electrode at the bottom of said cavity directly opposite to said first electrode and in rectifying contact with the high resistivity portion of the die.

4. A process for fabricating a transistor which comprises providing a semiconductor wafer of high resistivity of the order of 20 ohm-centimeters, diffusing an impurity into the wafer to provide a surface layer of one conductivity type over all the surfaces of the wafer having a resistivity of the order of 0.1 ohm-centimeter, subdividing the wafer into dice, directing a first jet composed of a solution of a salt of a selected metal onto one face of one of the dice, passing an electric current through the jet and the die to clean said face without penetrating through said surface layer, reversing the current through said jet to plate a first electrode on said face in rectifying contact with said surface layer, directing a second jet of a salt of a selected metal onto the opposite face of the die, passing an electric current through said second jet and the wafer to etch a cavity in said opposite face extending into the die beyond the surface layer, and reversing the current through said second jet and die to plate a second electrode at the bottom of said cavity directly opposite said first electrode and in rectifying contact with the high resistivity portion of the die.

5. The process of claim 4 in which said impurity is chosen from the group including antimony and arsenic to provide an n-type surface layer.

6. The process of claim 4 in which said first and second jets are formed of a solution of zinc sulphate, ammonium acetate, and ammonium chloride.

7. A process for making transistors which comprises diffusing an n-type impurity into opposite faces of a wafer of high resistivity n-type conductivity germanium to a predetermined depth and with a predetermined concentration gradient, said depth of the diffused layers being such relative to the thickness of the wafer that there is left a substantially undiffused substrate, forming a pit through one of the diffused portions, forming a rectifying contact on the bottom of the pit directly on the substrate, and forming a second rectifying contact on the face of the wafer opposite to that in which the pit is formed.

8. A process for making transistors which comprises diffusing antimony to a predetermined depth and with a predetermined concentration gradient for forming a base layer on one surface of a slice of n-type high resistivity germanium so as to leave an undiffused substrate, forming an emitter electrode by the jet-etch-plate technique on the surface of the base region to form a rectifying junction at said emitter electrode, forming an ohmic base contact on the outer surface of the base layer so that there is low resistance path between the base contact and the emitter electrode, and forming a collector electrode by the jet-etch plate technique on the face of the slice opposite the base layer in rectifying contact with the undiffused substrate of the material.

9. A process for forming die assemblies which comprise slicing a single semiconductor crystal into wafers, diffusing an impurity of one conductivity type into at least one face of each wafer in such a manner as to leave an undiffused portion, dicing each wafer to form dice, fusing several dice to an elongated base strip to form base connections therebetween at the outer face of the diffused layer, forming emitter electrodes at substantially the outer face of the diffused layer, forming collector electrodes on the faces of the dice opposite to the emitter electrodes, and cutting the base strip to form individual die assemblies.

10. A process of forming semiconductor devices comprising forming a semiconductor die having first and second layers of one type conductivity on opposite faces thereof and also being provided with a high resistivity substrate between said layers, forming a plated electrode on said first layer in rectifying contact therewith, cutting a cavity through the second layer, and forming a second electrode on the substrate at the bottom of the cavity.

11. A p-n-n'-p transistor which comprises a germanium die having an n'-type substrate and first and second diffused base layers of low resistivity n-type conductivity forming opposite faces of the die, said first base layer having an impurity concentration gradient decreasing approximately exponentially from the outer surface thereof to the substrate, said die also having an emitter pit of a predetermined depth formed in the outer portion of the first diffused base layer and a collector pit of a predetermined depth extending from the outer surface of the second base layer entirely through the second base layer to the substrate, an emitter electrode formed on the bottom of the emitter pit in rectifying contact with the first base layer, a collector electrode formed on the bottom of the collector pit in rectifying contact with the substrate, and a base electrode connected to the die.

12. A transistor comprising a semiconductor crystal die having a substrate layer of high resistivity and further having surface layers of low resistivity on opposite faces thereof, each of said surface layers having an impurity concentration gradient decreasing approximately exponentially from the outer surface thereof toward the interior of said die, a connection to one of said surface layers on one face of said die, the opposite face of said die having a cavity formed therein extending beyond the other surface layer, and a connection to said substrate layer at the bottom of the cavity.

13. A transistor comprising a semiconductor die having a pair of opposite faces, a pair of opposed surface layers of relatively low resistivity formed by diffusion of an impurity into said die, a substrate layer of high resistivity, a jet-etched cavity extending through one of said surface layers into said substrate layer, a first connection formed on said substrate layer at the bottom of the cavity and a second connection formed on the other surface layer.

14. A transistor comprising a germanium die having a pair of opposite surfaces, a pair of surface layers of relatively low resistivity formed by diffusion of an impurity into said die, a substrate layer of high resistivity, a jet-etched cavity extending through one of said surface layers and into said substrate layer, a jet-plated connection formed on said substrate layer at the bottom of the cavity and a second jet-plated connection formed on the other surface layer.

15. A transistor according to claim 14 wherein said jet-plated connections are composed of metallic zinc.

16. A process for making a transistor which comprises treating a body of crystalline semiconductor material having a high resistivity with a diffusant to provide a semiconductor die having a pair of opposed surface layers of lower, graded resistivity and a substrate layer of a high resistivity, jet-etching a cavity through one of said surface layers into said substrate layer, forming a first connection on said substrate layer at the bottom of said cavity and forming a second connection on the other surface layer.

17. A process for making a transistor which comprises treating a body of crystalline semiconductor material having a high resistivity with a diffusant to provide a semiconductor die having a pair of opposed surface layers of lower, graded resistivity and a substrate layer having a high resistivity, jet-etching a cavity through one of said surface layers into said substrate layer, jet-plating a first connection on said substrate layer at the bottom of the cavity and jet-plating a second connection on the other surface layer.

18. A process for making a transistor which comprises treating a body of germanium having a high resistivity with a diffusant to provide a germanium die having a pair of opposed surface layers of lower graded resistivity and a substrate layer having a high resistivity, jet-etching a cavity through one of said surface layers into said substrate layer, jet-plating a first zinc connection on said substrate layer at the bottom of the cavity and jet-plating a second zinc connection to the other surface layer.

19. A transistor comprising a semiconductor crystal body having a substrate layer and surface layers on opposite sides thereof, each of said surface layers having a resistivity gradient therethrough, a connection to one of said surface layers, said body having a cavity therein extending through the other surface layer, and a connection to said substrate layer at the bottom of the cavity.

20. A process for making a transistor which comprises treating a semiconductor crystal body to provide a body having a substrate layer and surface layers on opposite sides thereof with said surface layers each having a resistivity gradient therethrough, forming a cavity extending through one of said surface layers and exposing said substrate layer, forming a connection to the exposed substrate layer, and forming a connection to the other surface layer.

References Cited in the file of this patent

UNITED STATES PATENTS

| | | |
|---|---|---|
| 2,561,411 | Pfann | July 24, 1951 |
| 2,629,800 | Pearson | Feb. 24, 1953 |
| 2,777,101 | Cohen | Jan. 8, 1957 |
| 2,792,539 | Lehovec | May 14, 1957 |
| 2,794,846 | Fuller | June 4, 1957 |
| 2,820,154 | Kurshan | Jan. 14, 1958 |